(12) United States Patent
Vera Villarroel et al.

(10) Patent No.: US 11,309,845 B2
(45) Date of Patent: Apr. 19, 2022

(54) RECONFIGURABLE OPTICAL RECEIVERS FOR EXTENDED MAXIMUM INPUT SIGNALS

(71) Applicant: Elenion Technologies, LLC, New York, NY (US)

(72) Inventors: Ariel Leonardo Vera Villarroel, Union City, NJ (US); Abdelrahman Ahmed, Brooklyn, NY (US); Alexander Rylyakov, Staten Island, NY (US)

(73) Assignee: Nokia Solutions and Networks Oy, Espoo (FI)

( * ) Notice: Subject to any disclaimer, the term of this patent is extended or adjusted under 35 U.S.C. 154(b) by 54 days.

(21) Appl. No.: 16/838,289

(22) Filed: Apr. 2, 2020

(65) Prior Publication Data

US 2020/0235705 A1    Jul. 23, 2020

Related U.S. Application Data

(63) Continuation of application No. 16/126,797, filed on Sep. 10, 2018, now Pat. No. 10,644,652.

(51) Int. Cl.
| | |
|---|---|
| *H03F 1/08* | (2006.01) |
| *H03F 3/45* | (2006.01) |
| *H03G 3/30* | (2006.01) |
| *H04B 10/66* | (2013.01) |

(52) U.S. Cl.
CPC ......... *H03F 1/086* (2013.01); *H03F 3/45179* (2013.01); *H03G 3/3084* (2013.01); *H04B 10/66* (2013.01); *H03F 2200/129* (2013.01); *H03F 2203/45524* (2013.01); *H03F 2203/45691* (2013.01)

(58) Field of Classification Search
CPC ................. H03F 1/086; H03F 3/45179; H03F 2203/45691; H03F 2200/129; H03F 2203/45524; H03F 2203/45522; H03F 1/34; H03F 3/45085; H03F 3/45475; H03F 2200/408; H03G 3/3084; H03G 1/0088; H04B 10/66; H04B 10/6931
See application file for complete search history.

(56) References Cited

U.S. PATENT DOCUMENTS

2012/0242408 A1*  9/2012  Huang ................ H03F 3/45098
                                                                330/254

* cited by examiner

*Primary Examiner* — Tony Ko
(74) *Attorney, Agent, or Firm* — Stratford Group Ltd.

(57) ABSTRACT

In optical receivers, extending the transimpedance amplifier's (TIA) dynamic range is a key to increasing the receiver's dynamic range, and therefore increase the channel capacity. Ideally, the TIA requires controllable gain, whereby the receiver can modify the characteristics of the TIA and/or the VGA to process high power incoming signals with a defined maximum distortion, and low power incoming signals with a defined maximum noise. A solution to the problem is to provide TIA's with reconfigurable feedback resistors, which are adjustable based on the level of power, e.g. current, generated by the photodetector, and variable load resistors, which are adjustable based on the change in impedance caused by the change in the feedback resistor.

20 Claims, 11 Drawing Sheets

RECONFIGURABLE OPTICAL RECEIVERS FOR EXTENDED MAXIMUM INPUT SIGNALS

CROSS-REFERENCE TO RELATED APPLICATIONS

This application is a continuation of and claims priority to, which is a continuation of and claims priority from U.S. patent application Ser. No. 16/126,797, filed Sep. 10, 2018, now allowed, which is hereby incorporated by reference herein in its entirety.

TECHNICAL FIELD

The present invention relates to an optical receiver, and in particular to a reconfigurable optical receiver for extended maximum input signals.

BACKGROUND

Information is transmitted in an optical channel using optical modulation. In a receiver, the received optical signal contains the information, which could have been modulated in amplitude, phase, polarization or a combination thereof. The demodulation of the optical signal is done using a transducer, e.g. photodiode, that converts from the optical to the electrical domain. The transducer delivers an electrical signal, which is processed to extract the information contained in the optical signal. The maximum to minimum optical power, i.e. dynamic range, together with the transducer define the received electrical signal dynamic range. Modern communication systems use complex modulation schemes, e.g. quadrature modulation, to increase the communication channel efficiency. The efficiency of complex modulation schemes is proportional to the maximum operation frequency, i.e. baud rate, and dynamic range.

The received optical signal is transformed to an electrical signal using a transducer. Most transducers convert optical signals to electrical current. However, the current magnitude, which is proportional to the received optical power, needs to be amplified. Typically, during amplification the electrical current is converted to a voltage. The current-to-voltage amplifier, or transimpedance amplifier, remains one of the most challenging components in an optical receiver.

Large values of optical power, define high magnitude currents at the transducer output. High current at the TIA input will create distortion at the TIA output, typically due to non-linear behavior of the components used for amplification. The maximum input current a TIA can amplify, with a distortion below a defined maximum, defines the upper boundary of the TIA dynamic range.

The distortion generated in broadband signals can be quantified, by adding all the harmonics generated when a single tone signal is used at the input. The ratio of the output signal power, at the input signal tone frequency, to the total added power of the harmonics in the output signal is the total harmonic distortion, or THD.

On the other hand, small values of optical power, define small magnitude currents at the transducer output. However, small currents at the TIA input will be more sensitive to noise added by the TIA during amplification. The lower boundary of the TIA dynamic range is defined by the minimum input current that can be amplified, while still enabling the information to be recovered, even with the added TIA noise.

A variable gain TIA requires gain control, whereby the receiver can modify its characteristics to process high power incoming signals with a defined maximum distortion, and low power incoming signals with a defined maximum noise. Extending the TIA dynamic range is a key to increasing the receiver's dynamic range, and therefore increase the channel capacity.

Variable gain TIAs implement variable gain in their designs. Typically, the maximum gain of the TIA is not sufficient amplification, therefore, variable voltage-to-voltage amplifiers (VGAs) are cascaded in the receiver. VGAs contribute to limit the upper boundary of the dynamic range because they add distortion when large signals are amplified, generally at low gain values. Moreover, they also contribute to limit the lower boundary of the dynamic range because they add noise when small signals are amplified, generally at high gain values.

Individual optimization of each TIA and VGA is based on the behavior of each block at a given gain setting. Optimization of the overall chain, including the TIA and one or more VGAs, considers the assignment of gain, and bandwidth per block for a targeted receiver response. A variable gain TIA limits the receiver's dynamic range; therefore, increasing the maximum input for a given maximum added distortion at the output, becomes essential to extend the receiver's dynamic range.

An object of the present invention is to overcome the shortcomings of the prior art by providing a receiver including a TIA with variable gain for maximum input signal dynamic range, whereby the gain may be reduced for large input current signals, while adding the minimum amount of distortion, and whereby the gain may be increased for small input current signals, while adding the minimum amount of noise.

SUMMARY OF THE INVENTION

Accordingly, the present invention relates to an optical receiver comprising:

a photodetector capable of generating an input current in response to an optical signal;

a trans-impedance amplifier (TIA) capable of converting the current into a voltage;

wherein the TIA includes: a first feedback loop including: a first input for receiving the current from the photodetector; a first transistor with first and second terminals, the first terminal connected to the first input, and the second terminal connected to a first output; and a first variable feedback resistor between the first terminals and the second terminals;

a variable gain amplifier (VGA) capable of amplifying the voltage to a desired output voltage;

a first variable load resistor connected between a voltage source and the second terminal in parallel with the first terminal; and a gain control circuit capable of transmitting a first feedback resistor control signal for reconfiguring a resistance of the first feedback resistor for adjusting gain of the TIA, and capable of transmitting a first variable load resistor control signal to the first variable load resistor for reconfiguring a resistance of the first variable load resistor to compensate for a change in impedance caused by the change in resistance of the first feedback resistor.

Another feature of the present invention relates to an optical receiver comprising:

a photodetector capable of generating an input current in response to an optical signal;

a trans-impedance amplifier (TIA) capable of converting the current into a voltage;

wherein the TIA includes a first feedback loop including: a first input for receiving the current from the photodetector; a first transistor with first, second and third terminals, the first terminal connected to the first input, and the second terminal connected to a first output; and a first variable feedback resistor between the first terminals and the second terminals;

a variable gain amplifier (VGA) capable of amplifying the voltage to a desired output voltage;

a variable biasing component connected to the third terminal in parallel; and a gain control circuit capable of transmitting a first feedback resistor control signal for reconfiguring a resistance of the first feedback resistor for adjusting gain of the TIA, and capable of transmitting a biasing control signal to the variable biasing component for reconfiguring a transconductance of the variable biasing component to compensate for a change in impedance caused by the change in resistance of the first feedback resistor.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
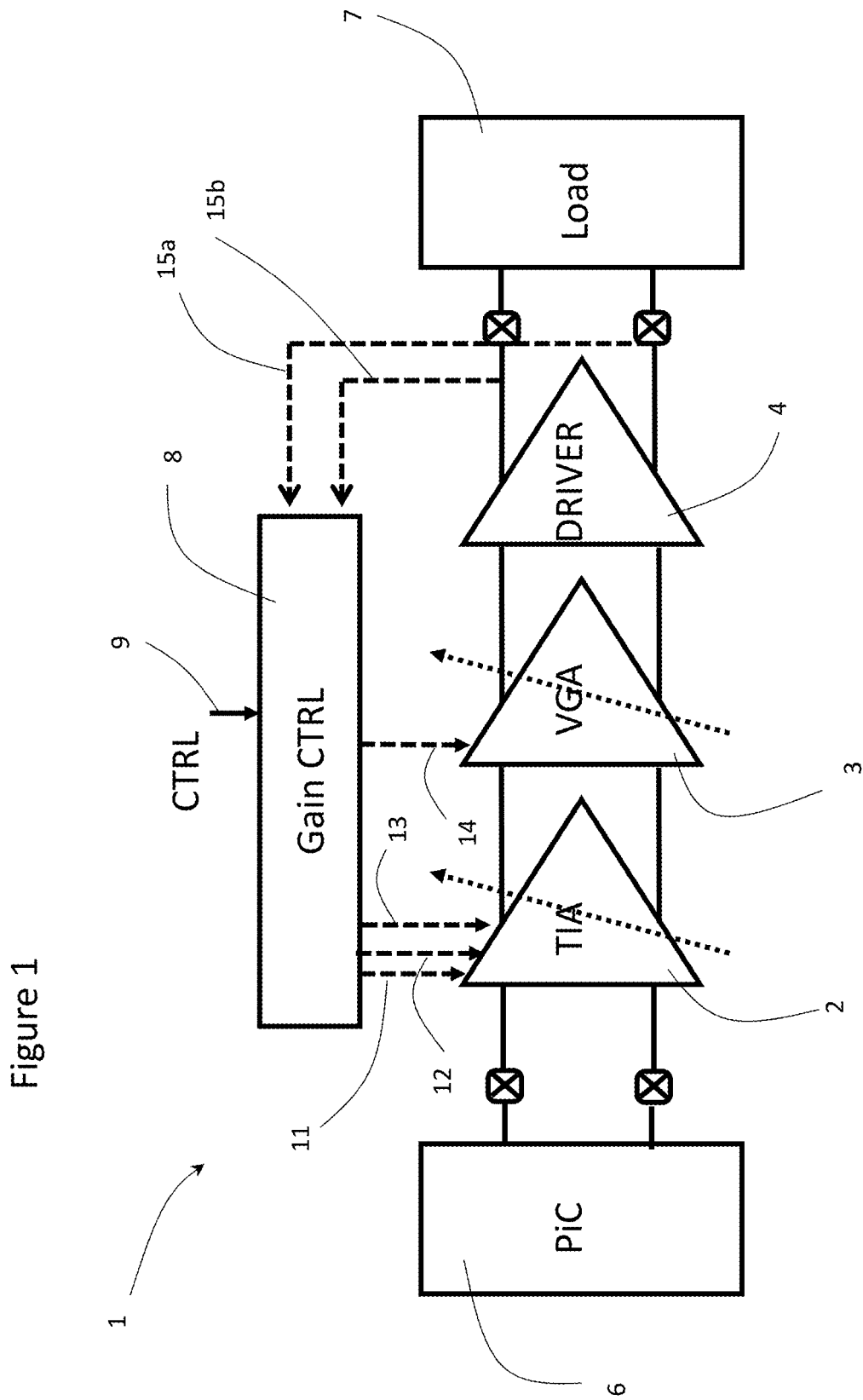
FIG. 1 is a schematic diagram of an optical receiver in accordance with an embodiment of the present invention.

With reference to FIG. 1, a receiver 1 includes a variable gain trans-impedance amplifier (TIA) 2 for converting a photodiode current signal into a voltage signal, a variable gain amplifier (VGA) 3 for amplifying the voltage signal, and a driver stage 4 for driving subsequent stages, e.g. ADC. The front end of the receiver 1 may be connected to a general transducer, which may be contained in a photonic integrated circuit (PIC) 6 including one or more transducers, such as one or more photodetectors, and preferably a pair of photodiodes. The back end of the receiver 1 may be connected to an output load, e.g. a digital signal processor 7 for converting the output of the receiver 1 into digital signals.

The receiver 1 includes a Gain Control Circuit (GCC) 8 to set the gain of the TIA 2 and the VGA 3, via TIA and VGA gain control signals 11, 12, 13 and 14, respectively, for a given range of input signal power and desired range of output signal power. The gain control circuit 8 is typically implemented as an open loop control or a close loop control. An open loop implementation sets the gain of the TIA 2 and the VGA 3 according to an overall gain control signal 9 from a device controller (not shown). A closed loop control senses the output signal power from the TIA 2, the VGA 3 or the driver stage 4, via feedback signals 15a and 15b to a power, e.g. voltage, detector in the gain control circuit 8, and varies the gain of the TIA 2 and the VGA 3 to set the desired output voltage magnitude. The closed loop mode is also known as automatic gain control (AGC). The performance of the receiver 1 is determined by the individual block's performances and the gain control scheme.

The present solution enables the TIA 2 to be reconfigurable according to the input signal magnitude to offer low distortion for large input (current) signals, effectively increasing the dynamic range of the receiver 1.

Figure 2:
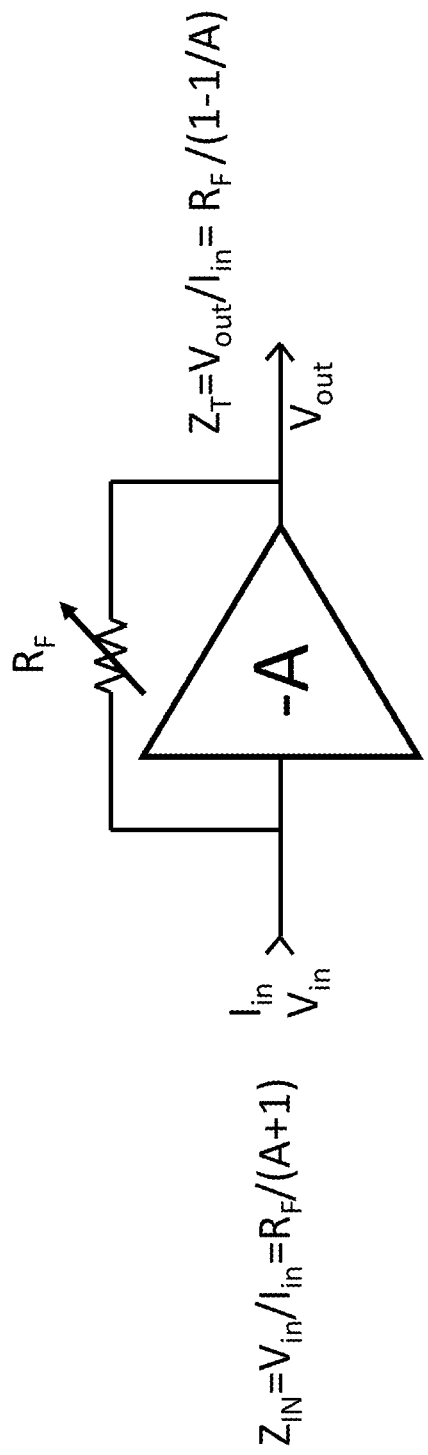
FIG. 2 is a schematic diagram of a trans-impedance amplifier (TIA) of the optical receiver of FIG. 1.

An ideal transimpedance amplifier with variable gain is illustrated in FIG. 2. The TIA gain (ZT) is proportional to the feedback resistor RF (ZT: Vout/Iin=RF/(1−1/A)), therefore, the gain ZT can be controlled by controlling RF, i.e. varying the feedback resistor RF. The TIA input impedance (ZIN=Vin/Iin=RF/(A+1)) approaches zero when the open loop gain A approaches infinity. In practice, the open loop gain A depends on the components used to implement it. Using a variable resistor RF to control the gain ZT, also changes the TIA input impedance ZIN.

Figures 3A, 3B:
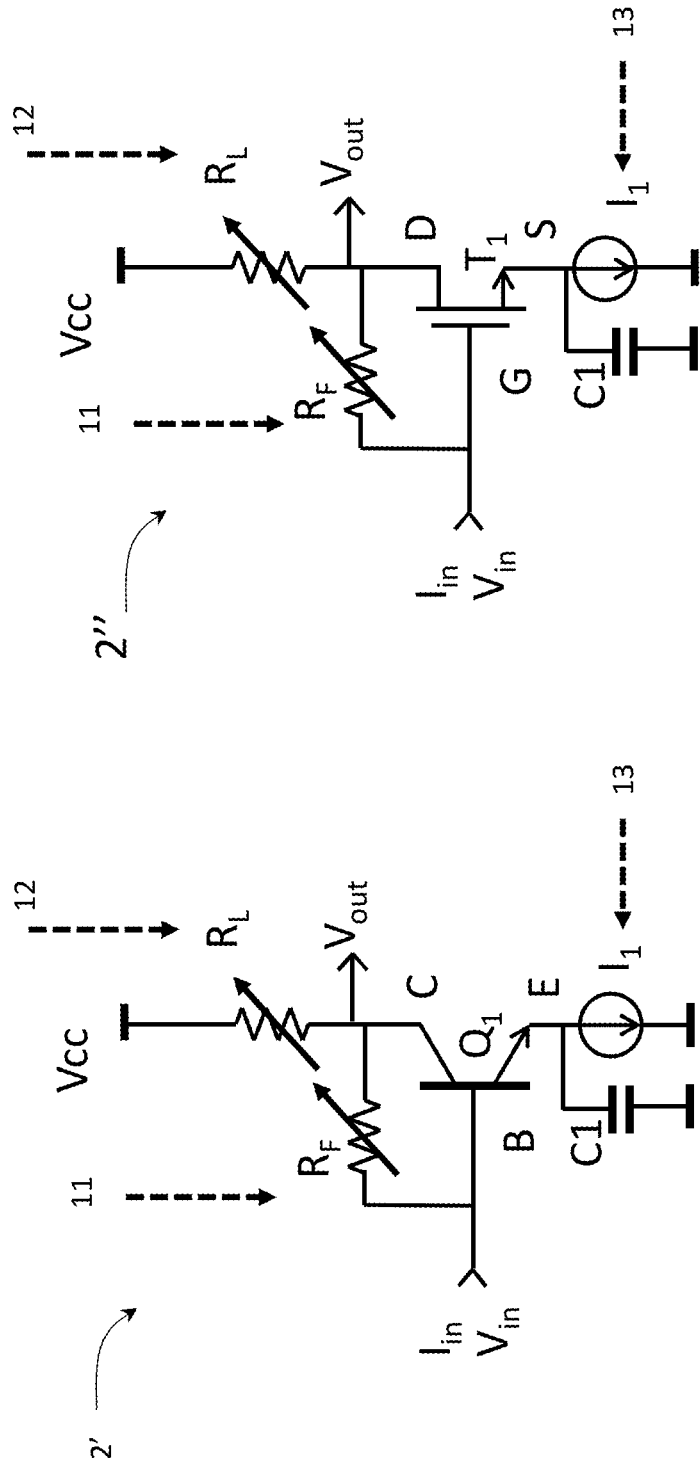
FIG. 3A is a schematic diagram of a linear trans-impedance amplifier (TIA) using SiGe technology of the optical receiver of FIG. 1.
FIG. 3B is a schematic diagram of a linear trans-impedance amplifier (TIA) using CMOS technology of the optical receiver of FIG. 1.

With reference to FIG. 3A, an embodiment of a TIA 2' in accordance with the present invention includes a single transistor Q1 based on SiGe bipolar technology, including a first terminal, e.g. base B, connected to a single linear input Iin, a second terminal, e.g. an emitter E, connected to a biasing component, e.g. a DC current source T1 that offers a low impedance to ground, represented by a capacitor C1, and a third terminal, e.g. collector C, connected to a single linear output Vout. A variable feedback resistor RF is connected between the first and third terminals, e.g. collector C and the base B, and a variable load resistor RL is connected between a DC voltage source VCC and the third terminal, e.g. collector C.

The proposed solution description is based in a SiGe bipolar technology, however, the reconfigurable principle presented herein may be applied to CMOS or other technologies. With reference to FIG. 3B, an alternative embodiment of a TIA 2" in accordance with the present invention includes a single transistor T1 based on CMOS technology including a first terminal, e.g. gate G, connected to a single linear input tin, a second terminal, e.g. source S, connected to a DC current source T1 that offers a low impedance to ground, represented by a capacitor C1, and a third terminal, e.g. drain D, connected to a single linear output Vout. The variable feedback resistor RF is connected between the first and third terminals, e.g. the drain D and the gate G, with the biasing component, e.g. the current source T1, is connected to the second terminal, e.g. source S.

Furthermore, although the aforementioned examples illustrate a single-input single-output design with the optical receiver with a single linear input and output, and each of the transistor components comprising a single transistor Q1 or T1, alternative embodiments including each of the transistor components including a differential transistor pair Q1 and Q2 or T1 and T2, is also within the scope of this invention.

Dynamic range is limited by the acceptable noise and distortion. Accordingly, a signal with "low", power, current or voltage will require large amplification. The receiver (TIA+VGA+DRIVER) will add noise when amplifying, therefore, a "low" signal is in the lower portion of the device's dynamic range, in which the signal can be amplified with noise added, whereby the information can still be recovered from the original signal. A "high" signal, on the other hand, requires less amplification. The receiver will add distortion when amplifying, then a high signal is in the upper portion of the device's dynamic range, in which the signal can be amplified and distortion added, whereby the information can still be recovered from the original signal.

Figure 4:
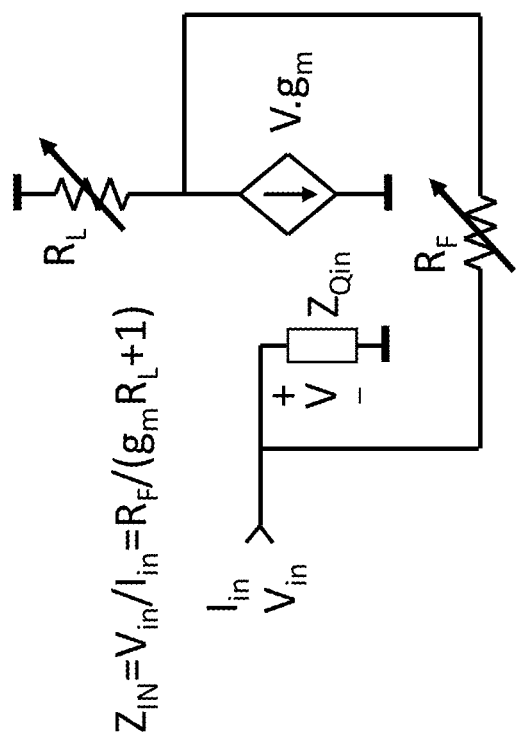
FIG. 4 is a schematic diagram of the trans-impedance amplifier (TIA) small signal equivalent circuit of FIG. 1.

The gain ZT in a TIA 2 may be defined by the circuit's implementation. With reference to FIG. 4, the active gain A may be equal to the transconductance (gm) of the TIA 2 multiplied by the resistance of the load resistor RL. Low gain settings, required for large input currents, may be obtained by reducing the value of the feedback resistor RF. However, changing the resistance value of the feedback resistor RF also change the TIA input impedance ZIN. The effects associated with the TIA impedance change may be reduced by varying the resistance of the load resistor RL and/or the transconductance gm of the TIA 2 such the input impedance ZIN remains more or less constant when the TIA gain ZT is reduced.

Figure 5:
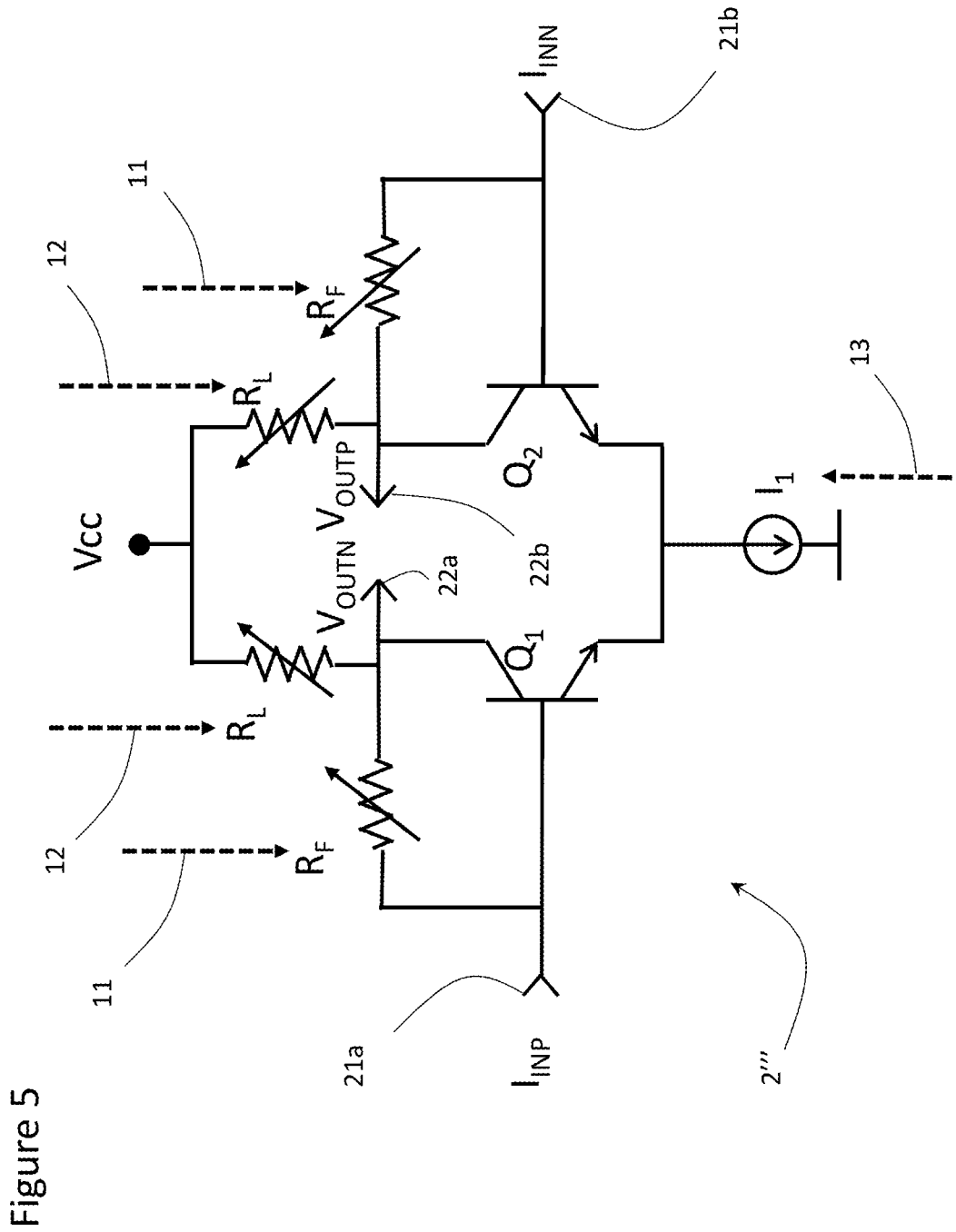
FIG. 5 is a schematic diagram of a differential trans-impedance amplifier (TIA) of the optical receiver of FIG. 1.

With reference to FIG. 5, a simplified differential TIA 2' may include differential inputs 21a and 21b for currents IINP and IINN, respectively, from the front end 6, and differential outputs 22a and 22b, for voltages VOUTP and VOUTN, for transmission to the VGA 3. The TIA gain ZT in this topology is also varied by changing the value of the feedback resistor RF, and the input impedance ZIN is modified by changing the resistance of the load resistor RL and/or the transconductance gm of the TIA 2 via adjustment of the bias current I1.

Figure 6:
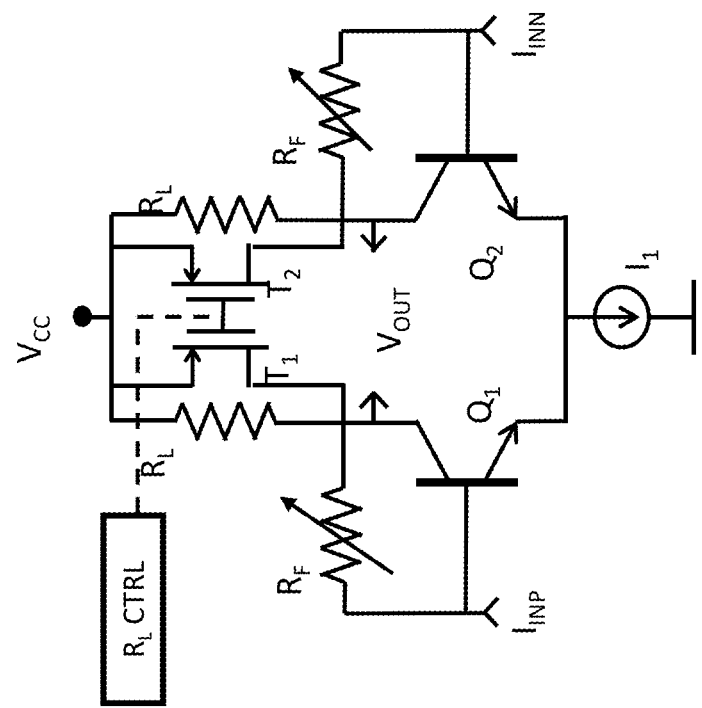
FIG. 6 is a schematic diagram of a trans-impedance amplifier (TIA) of the optical receiver of FIG. 1 with a variable load resistor.
Figure 7:
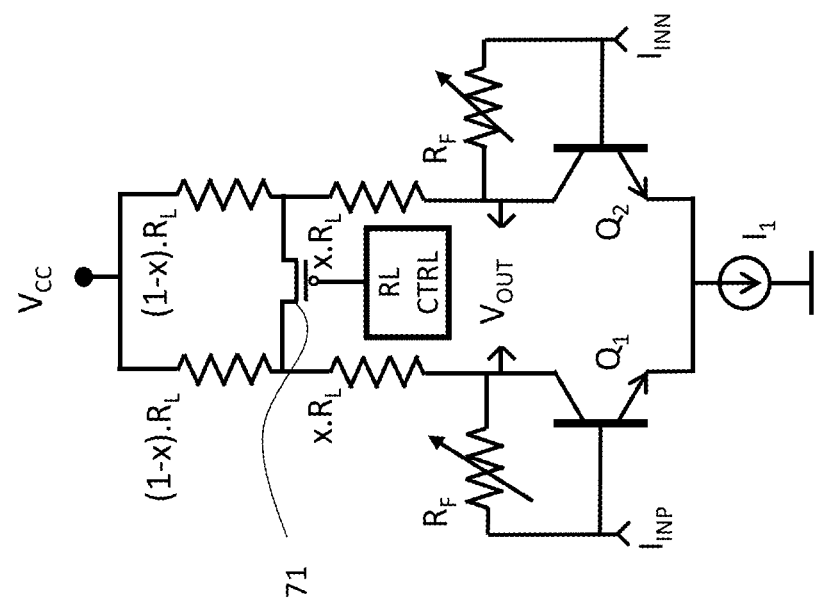
FIG. 7 is a schematic diagram of a trans-impedance amplifier (TIA) of the optical receiver of FIG. 1 with an alternate embodiment of a variable load resistor.
Figure 8:
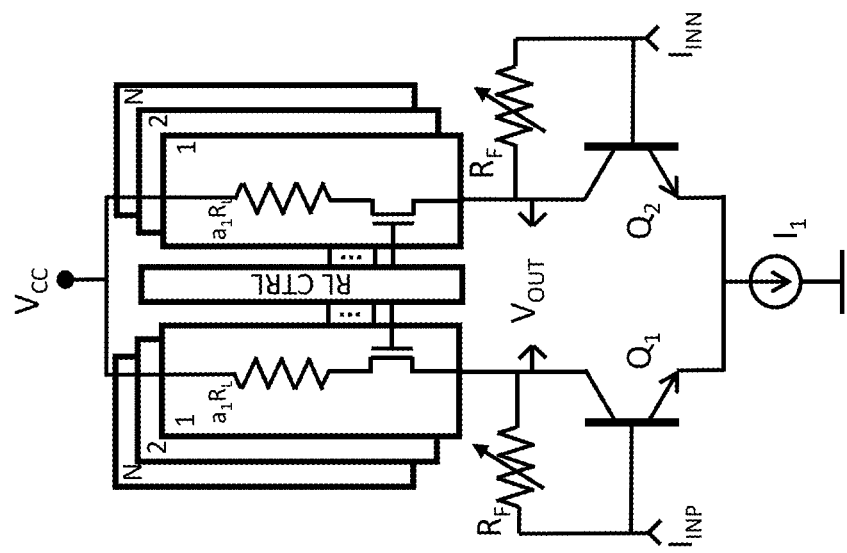
FIG. 8 is a schematic diagram of a trans-impedance amplifier (TIA) of the optical receiver of FIG. 1 with an alternate embodiment of a variable load resistor.

The present embodiments focus on the variation of the resistance of the load resistor RL in order to compensate for the effects introduced when the feedback resistor RF is varied to change the TIA gain ZT. However, the transconductance gm of the TIA 2 can also be varied with the same objective. Three different implementations, shown in FIGS. 6, 7, and 8 are for exemplary purposes only, but are not the only possible implementations. Other implementations are possible with the same goal, i.e. compensate for the change in input impedance ZIN introduced by the variation of the feedback resistor RF.

With reference to FIG. 6, the variation of the resistance of the variable load resistors RL may be obtained using one of load resistor (RL) transistors T1 and T2 in parallel with a respective one of the load resistors RL. The RL transistors T1 and T2 may operate as variable resistors when biased in their linear region. The variation of the resistance of the transistors T1 and T2 and therefore the adjustment of the effective resistance provided by the load resistors RL to the TIA 2 may be achieved by adjusting the bias of the RL transistors T1 and T2 with the variable load resistor (RL) control signal 12.

With reference to FIG. 7, the variation of the resistance of the variable load resistors RL may be done by introducing one or more partitions in the load resistor RL, and dividing the load resistor into a plurality of components in series, e.g. two components, (1−x)RL and xRL. x being some suitable fraction, e.g. from 0.4 to 0.75. A load resistor control circuit 71, e.g. comprised of one or more transistors, may be used to short one or more of the RL components, e.g. the top half components (1−x)RL, when turned on by the RL control signal 12, whereby the effective load resistance RL provided by the load resistor RL may be xRL. When the load resistor control circuit 71 is turned off, the total effective resistance provided by the load resistor RL is ((1−x)+x) the total of all of the components RL.

With reference to FIG. 8, another possible implementation includes a load resistance control, which is achieved digitally. The load resistor RL may be divided into a plurality of components connected in parallel, e.g. 1, 2, ... N components, each component controlled digitally with a switch connected in series. When a switch is set ON by the RL control signal 12, the one or more selected resistor components is connected to the TIA output, when the switch is OFF, the component is not part of the TIA load. Each component may have a different resistance, and may be turned on one at a time or in combination to provide increased control over the effective resistance provided by the variable load resistor RL.

The variable feedback resistor (RF), controlled by the TIA gain control signal 11 from the GCC 8, may be used to set the gain of the TIA 2 (gain~RF when the transconductance gm of the TIA 2 x the load resistor RL is large, i.e. gm x RL>>1). Typically, the variable feedback resistor RF is positioned in a feedback loop between a first terminal, e.g. the gate or base, of each transistor Q1 and Q2 and one of the other two terminals, e.g. drain or collector. A DC supply voltage VCC and a DC current source I1 along with variable load resistor RL may be used for biasing the first transistor component, e.g. differential pair Q1 and Q2, under control of the GCC 8. The gain control (or variable feedback resistor) signal 11 may be transmitted by the GCC 8 to control the variable feedback resistor RF, and as a result the gain of the TIA 2. Adjusting the feedback resistor RF also results in a change in the impedance ZIN of the TIA 2. Accordingly, to compensate for the change in TIA impedance ZIN, the GCC 8 may adjust at least one of the resistance of the variable load resistor RL or the transconductance gm of the TIA by varying the biasing DC current source I1. The variable load resistance signal 12 may be transmitted by the GCC 8 to control the variable load resistor RL by adjusting the resistance provided by the variable load resistor RL. The bias control signal 13 may be transmitted by the GCC 8 for adjusting the active gain transconductance gm by controlling the biasing component, e.g. the bias current provided by the DC current source I1. The control signals 11, 12 and 13 may be sent by the GCC 8 independently or in combination depending upon on the requirements of the TIA 2. The input currents IINP and INN may then be transformed to output voltages VOUTP VOUTN.

The power detector in the GCC 8 may determine whether the power or level of the input signal falls with a predetermined portion, e.g. lower, middle or upper portions, of the dynamic range of the receiver 1 or the TIA 2. For example: when low magnitude input currents, e.g. in the lower half, third or quarter of the receiver's or TIA's dynamic range, are generated in the front end 6, large amplification by the TIA 2' is required with minimum added noise. Reducing the TIA load resistance generally reduces distortion for input currents in the upper part of the dynamic range of the input current, which don't require high amplification to achieve the desired Vout. Therefore, ideally the resistance of the load resistor RL may be reduced by the GCC 8 when input currents are high, e.g. in the upper portion (upper ½ or ¼) of the TIA's dynamic range, and maintained or increased when input currents are small, e.g. in the lower portion (lower ½ or ¼) of the TIA's dynamic range. Accordingly, the GCC 8 may transmit at least one of the variable load resistance signal 12 and the bias control signal 13 to reduce the TIA load resistance when the input current is in the upper part, e.g. upper half or upper third, of the dynamic range of the TIA. Alternatively, the GCC 8 may transmit the variable load resistance signal 12 and/or the bias control signal 13 to increase the TIA load resistance when the input current is in the lower part, e.g. lower half or lower third, of the dynamic range of the TIA depending on the structure and functionality of the variable load resistor RL. Selecting the resistance setting for the variable load resistor RL may be dependent upon several factors, such as input current, output voltage, wavelength, and distortion profile; accordingly, the selection may be a "best fit" option based on experience with or testing of the specific application.

Control of the reconfiguration between optimum noise and optimum total harmonic distortion (THD) is implemented in the control circuit 8. The control may be static or dynamic depending on the system requirements. For static gain control with reference to FIG. 1, the input signal CTRL 9 is mapped to a specific gain setting for the TIA 2 and the VGA 3. Therefore different mappings between the CTRL signal 9 and the TIA and VGA gain control signals 11, 12, 13 and 14 may be defined to control the overall gain, which allows a trade-off between optimum noise and optimum linearity. For automatic gain control (refer to FIG. 1), feedback signals 15*a* and 15*b* are transmitted to the GCC 8, which includes a power detector to determine the output power level, e.g. voltage, of the signals output from the Driver 4. The GCC 8 then delivers control signals 11, 12, 13 and 14 that are used to set the gains of the TIA 2 and the VGA 3 based on the overall gain control signal 9. The gains in the TIA 2, e.g. feedback resistor RF and load resistor RL, and/or the VGA 3 are modified automatically until the output of the power detector matches the external signal.

Figure 9:
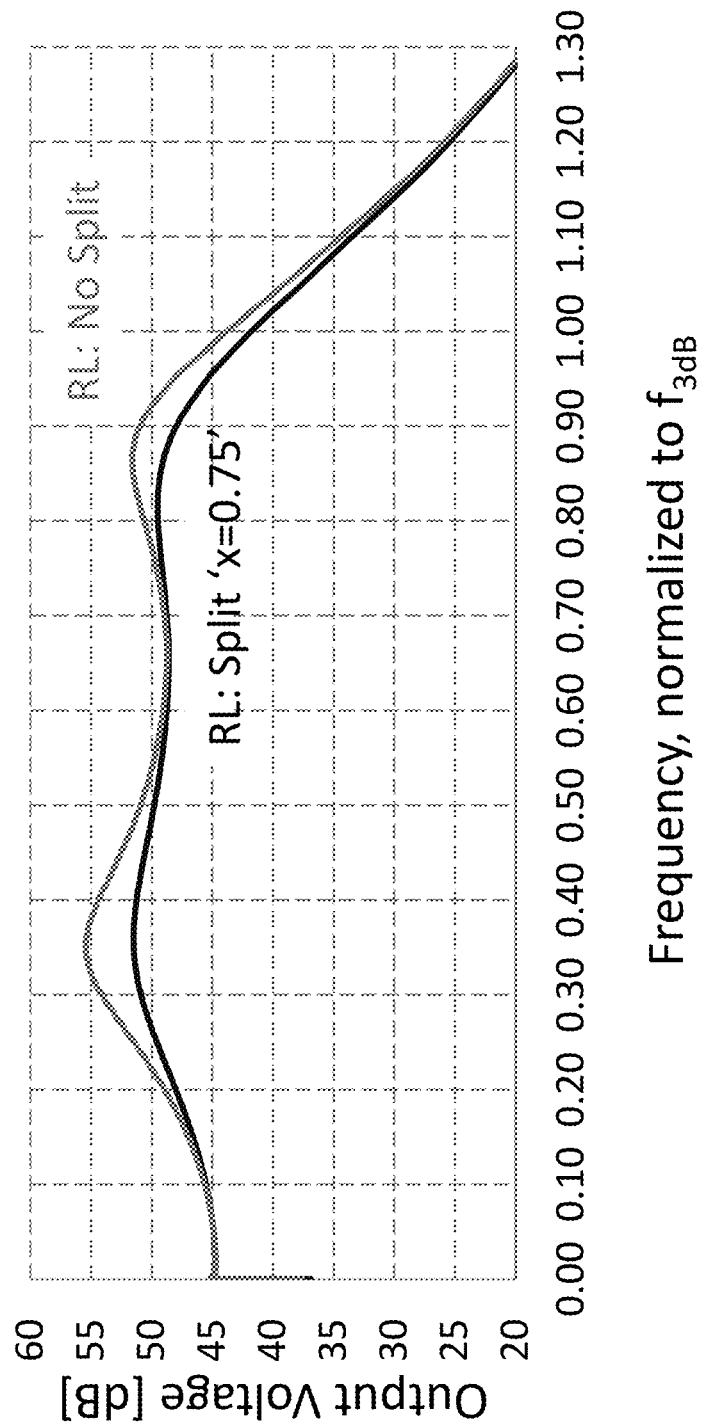
FIG. 9 is a plot of Output Voltage (dB) vs. Normalized Frequency for two differently calibrated TIA load resistors.

FIG. 9 illustrates the output voltage when the resistance of the variable load resistor RL is kept constant (No Split) and when varied, e.g. reduced to 75% of total (Split x=0.75). Reducing peaking at ⅓ of the −3 dB bandwidth translates to lower amplification of (undesired) harmonics and a more constant amplification across the desired frequency range. The low frequency gain remains constant, but the gain at 0.35 and 0.9 f3 dB is considerably different, roughly 4 dB in the reduction of the undesired peaking, when the load resistance is reduced to ¾ of the full load resistance. The consequence of the peaking reduction is more stable output voltage over frequency (FIG. 10), and lower distortion (FIG. 11).

Figure 10:
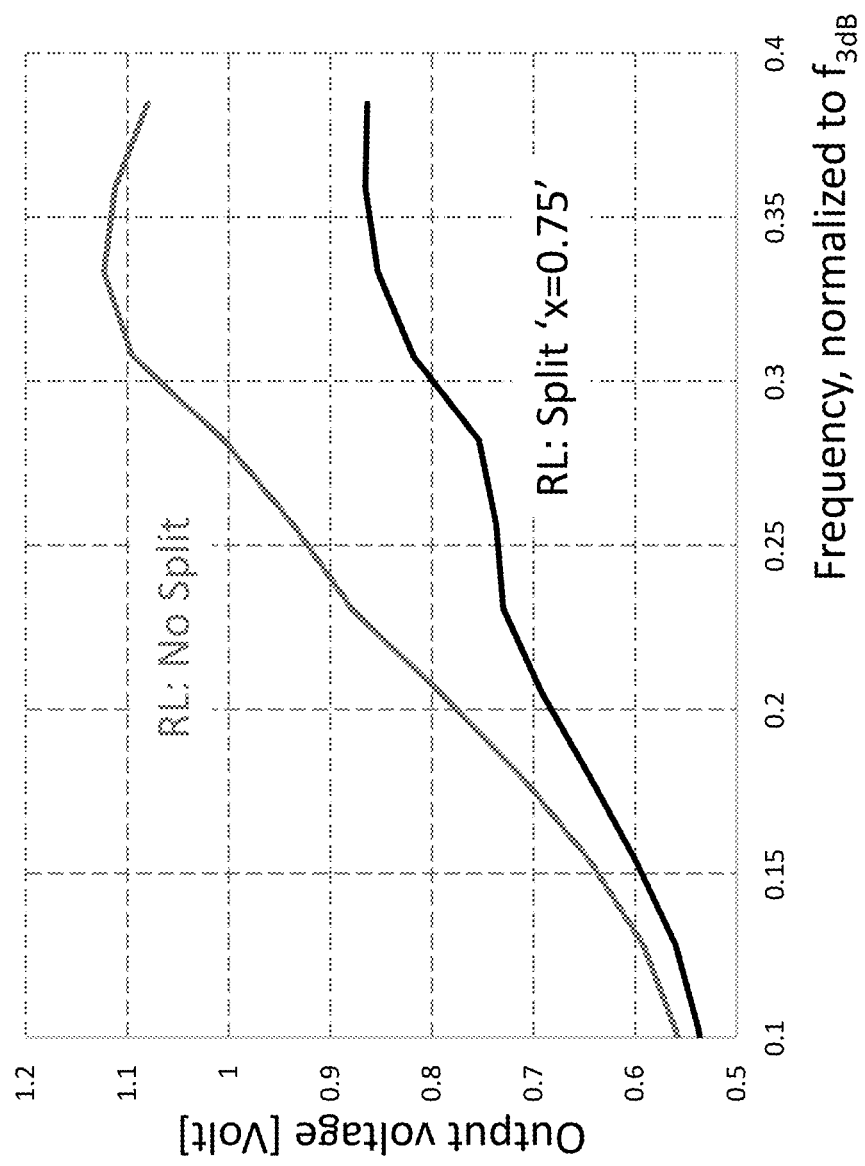
FIG. 10 is a plot of Output Voltage (V) vs. Normalized Frequency for two differently calibrated TIA load resistors.
Figure 11:
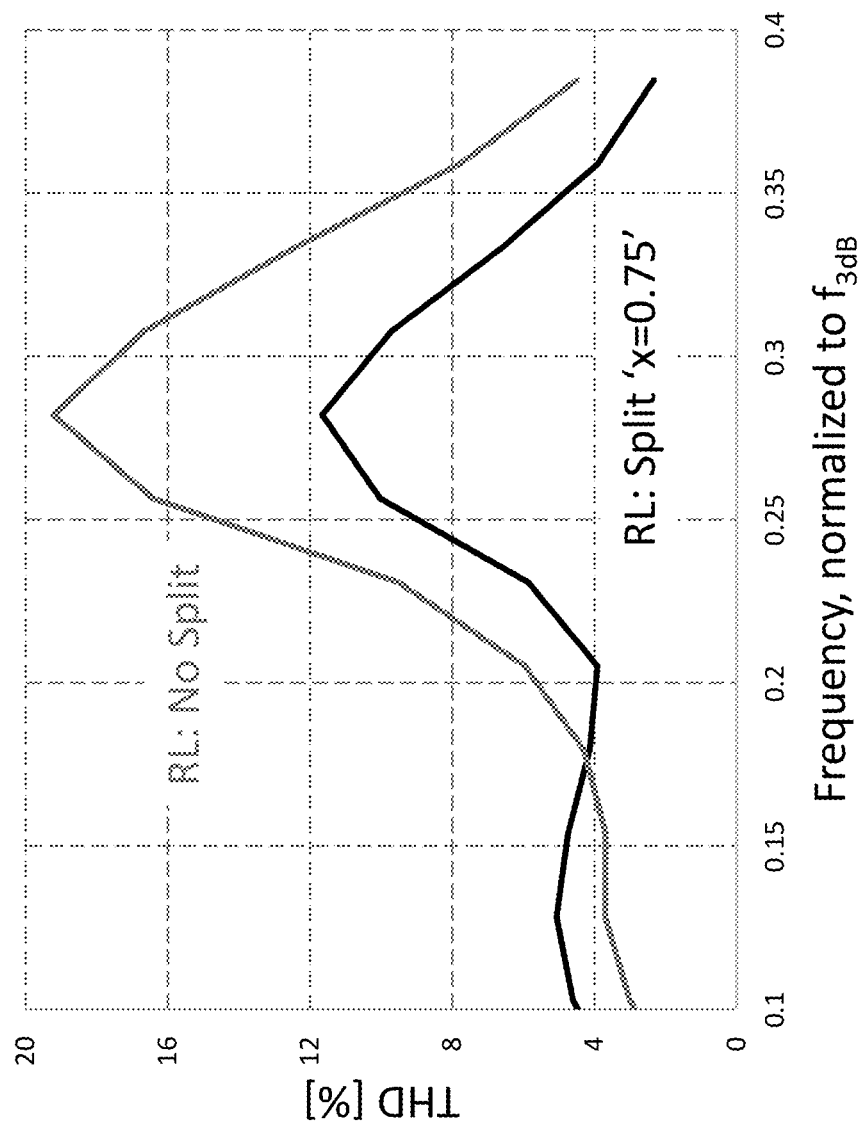
FIG. 11 is a plot of THD (%) vs. Normalized Frequency for two differently calibrated TIA load resistors.

FIGS. 10 and 11 illustrate a comparison with and without varying the resistance of the variable load resistor RL. FIG. 10 illustrates Output Voltage vs normalized frequency, and FIG. 11 illustrates total harmonic distortion (THD) vs normalized frequency. Variation of the resistance of the load resistor RL changes the TIA transfer function, reducing the peaking at higher frequencies providing a much more constant amplification across the frequency spectrum, whereby undesired higher order harmonics have less amplification, which translate to a reduction of distortion.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A trans-impedance amplifier (TIA) configured for converting an input current into an output voltage, comprising:
   a first feedback loop including:
      a first input for receiving the input current;
      a first transistor including a first terminal and a second terminal, the first terminal connected to the first input, and the second terminal connected to a first output; and
      a first variable feedback resistor between the first terminal and the second terminal;
   a first variable load resistor connected between a voltage source and the second terminal; and
   a gain control circuit configured for transmitting a first feedback resistor control signal for reconfiguring a first feedback resistance of the first variable feedback resistor for adjusting gain of the TIA, and configured for transmitting a first variable load resistor control signal to the first variable load resistor for reconfiguring a first load resistance of the first variable load resistor;
   wherein the gain control circuit is also configured for sensing an output of the TIA, and based on the output of the TIA adjusting, at least, one of the first variable load resistor and the first variable feedback resistor.

2. The TIA according to claim 1, further comprising:
   a biasing component for biasing the first transistor;
   wherein the first transistor also includes a third terminal connected to the biasing component; and
   wherein the gain control circuit is configured for transmitting a bias control signal to the biasing component for adjusting the biasing component to change a transconductance of the TIA to compensate for a change in impedance caused by a change in the first feedback resistance.

3. The TIA according to claim 2, wherein the biasing component comprises a DC current source.

4. The TIA according to claim 1, wherein the gain control circuit is configured for reducing the resistance of the first variable load resistor when a level of the input current is within an upper part of a dynamic range of the TIA to compensate for a change in impedance caused by a change in the first feedback resistance.

5. The TIA according to claim 1, wherein the first variable load resistor comprises:
   a load transistor in parallel with a load resistor component;
      wherein the load resistor control signal is configured for biasing the load transistor to adjust the first load resistance provided by the load resistor component.

6. The TIA according to claim 1, wherein the first variable load resistor comprises a first load resistor component and a second load resistor component connected in series; and
   further comprising a load resistor control circuit in between the first load resistor component and the second load resistor component;
      wherein the load resistor control signal is configured for turning the load resistor control circuit on, thereby shorting the second load resistor component and adjusting the resistance provided by the first variable load resistor.

7. The TIA according to claim 1, wherein the first variable load resistor comprises:
a plurality of load resistor components in parallel; and
a switch in series with each load resistor component;
wherein the first variable load resistor control signal selects which switch and therefore which of the plurality of load resistor components provides resistance.

8. The TIA according to claim 1, wherein the gain control circuit is configured for adjusting the first variable load resistor based on the output of the TIA to compensate for a change in impedance caused by a change in the first feedback resistance.

9. The TIA according to claim 1, wherein the gain control circuit is configured for adjusting the first variable feedback resistor based on the output of the TIA.

10. The TIA according to claim 1, further comprising a variable gain amplifier (VGA) configured for amplifying the output voltage; wherein the gain control circuit is also configured for transmitting a VGA gain control signal to the VGA for adjusting VGA gain of the VGA.

11. The TIA according to claim 10, wherein the gain control circuit is also configured for sensing an output of the VGA, and adjusting the VGA gain based on the output of the VGA.

12. The TIA according to claim 1, further comprising:
a second feedback loop comprising:
a second input forming a differential input with the first input;
a second transistor forming a differential pair with the first transistor;
the second transistor including fourth and fifth terminals, the fourth terminal connected to the second input, and the fifth terminal connected to a second output; and
a second feedback resistor between the fourth terminal and the fifth terminal; and
a second variable load resistor connected between the voltage source and the fifth terminal in parallel with the fourth terminal;
wherein the gain control circuit is also configured for transmitting a second feedback resistor control signal for reconfiguring a second feedback resistance of the second feedback resistor, and configured for transmitting a second variable load resistor control signal to the second variable load resistor for reconfiguring a second load resistance of the second variable load resistor to compensate for a change in impedance caused by a change in the second feedback resistance.

13. A trans-impedance amplifier (TIA) configured for converting an input current into an output voltage, comprising:
a first feedback loop including:
a first input for receiving an input current;
a first transistor including a first terminal, a second terminal and a third terminal, the first terminal connected to the first input, and the second terminal connected to a first output; and
a first variable feedback resistor between the first terminals and the second terminals;
a variable biasing component connected to the third terminal in parallel; and
a gain control circuit configured for transmitting a first feedback resistor control signal for reconfiguring a first feedback resistance of the first variable feedback resistor for adjusting gain of the TIA, and configured for transmitting a biasing control signal to the variable biasing component for reconfiguring a transconductance of the variable biasing component;
wherein the gain control circuit is also configured for sensing an output of the TIA, and based on the output of the TIA adjusting, at least, one of the transconductance of the variable biasing component and the first variable feedback resistor.

14. The TIA according to claim 13, wherein the biasing component comprises a DC current source.

15. The TIA according to claim 13, wherein the gain control circuit is configured for reducing the transconductance of the variable biasing component when a level of the input current is within an upper part of a dynamic range of the TIA.

16. The TIA according to claim 13, wherein the gain control circuit is configured for adjusting the transconductance of the variable biasing component based on the output of the TIA.

17. The TIA according to claim 13, wherein the gain control circuit is configured for adjusting the first variable feedback resistor based on the output of the TIA.

18. The TIA according to claim 13, further comprising a variable gain amplifier (VGA) configured for amplifying the output voltage; wherein the gain control circuit is also configured for transmitting a VGA gain control signal to the VGA for adjusting VGA gain of the VGA.

19. The TIA according to claim 18, wherein the gain control circuit is also configured for sensing an output of the VGA, and adjusting the VGA gain based on the output of the VGA.

20. The TIA according to claim 13, further comprising a first variable load resistor connected between a voltage source and the second terminal; and
wherein the gain control circuit is also configured for transmitting a first variable load resistor control signal to the first variable load resistor for reconfiguring a first load resistance of the first variable load resistor to compensate for a change in impedance caused by a change in the first feedback resistance.

* * * * *